(12) United States Patent
Wang et al.

(10) Patent No.: US 10,559,573 B2
(45) Date of Patent: Feb. 11, 2020

(54) STATIC RANDOM ACCESS MEMORY STRUCTURE

(71) Applicant: UNITED MICROELECTRONICS CORP., Hsin-Chu (TW)

(72) Inventors: Shu-Ru Wang, Taichung (TW); Ching-Cheng Lung, Tainan (TW); Yu-Tse Kuo, Tainan (TW); Chien-Hung Chen, Taipei (TW); Chun-Hsien Huang, Tainan (TW); Li-Ping Huang, Miaoli County (TW); Chun-Yen Tseng, Tainan (TW); Meng-Ping Chuang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/162,340

(22) Filed: Oct. 16, 2018

(65) Prior Publication Data

US 2019/0096892 A1 Mar. 28, 2019

Related U.S. Application Data

(63) Continuation-in-part of application No. 15/795,247, filed on Oct. 26, 2017, now Pat. No. 10,153,287.

(30) Foreign Application Priority Data

Sep. 22, 2017 (CN) .......................... 2017 1 0864959

(51) Int. Cl.
*H01L 27/11* (2006.01)
*G11C 11/412* (2006.01)
(Continued)

(52) U.S. Cl.
CPC ............ *H01L 27/1104* (2013.01); *G11C 5/06* (2013.01); *G11C 7/18* (2013.01); *G11C 8/14* (2013.01);
(Continued)

(58) Field of Classification Search
CPC .................................................. H01L 27/1104
See application file for complete search history.

(56) References Cited

U.S. PATENT DOCUMENTS 8,315,084 B2 11/2012 Liaw
8,675,397 B2 3/2014 Liaw
(Continued)

OTHER PUBLICATIONS

Nii, Title of Periodical: 2RW Dual-port SRAM Design Challenges in Advanced Technology Nodes, 2015.

*Primary Examiner* — Thao P Le
(74) *Attorney, Agent, or Firm* — Winston Hsu

(57) ABSTRACT

A layout pattern of a static random access memory (SRAM) includes a substrate, a first pull-up transistor (PL1), a first pull-down transistor (PD1), a second (PL2), and a second pull-down transistor (PD2) on the substrate, and a first pass gate transistor (PG1A), a second pass gate transistor (PG1B), a third pass gate transistor (PG2A) and a fourth pass gate transistor (PG2B), wherein the PG1A and the PG1B comprise a first fin structure, the PG2A and the PG2B comprise a second fin structure, a first local interconnection layer disposed between the PG1A and the PG1B and disposed on the fin structures of the PL1 and the PD1, a second local interconnection layer disposed between the PG2A and the PG2B and disposed between the fin structures of the PL2 and the PD2, the first local interconnection layer and the second local interconnection layer are monolithically formed structures respectively.

22 Claims, 7 Drawing Sheets

(51) Int. Cl.
*G11C 5/06* (2006.01)
*G11C 8/14* (2006.01)
*G11C 7/18* (2006.01)
*H01L 27/02* (2006.01)
*H01L 27/12* (2006.01)
*H01L 27/092* (2006.01)

(52) U.S. Cl.
CPC ........ *G11C 11/412* (2013.01); *H01L 27/0207* (2013.01); *H01L 27/0924* (2013.01); *H01L 27/1211* (2013.01)

(56) References Cited

U.S. PATENT DOCUMENTS

| | | |
|---|---|---|
| 10,153,287 B1 * | 12/2018 | Wang .................. H01L 27/1104 |
| 2004/0099885 A1 | 5/2004 | Yeo |
| 2005/0029556 A1 * | 2/2005 | Wang .................... G11C 11/412 257/250 |
| 2006/0214233 A1 | 9/2006 | Ananthanarayanan |
| 2006/0220134 A1 | 10/2006 | Huo |
| 2010/0006945 A1 | 1/2010 | Merelle |
| 2014/0038402 A1 | 2/2014 | Wei |
| 2017/0047332 A1 | 2/2017 | Nii |

* cited by examiner

STATIC RANDOM ACCESS MEMORY STRUCTURE

CROSS REFERENCE TO RELATED APPLICATIONS

This application is a continuation in part application of U.S. patent application Ser. No. 15/795,247 filed Oct. 26, 2017, which is herein incorporated by reference in its entirety.

BACKGROUND OF THE INVENTION

1. Field of the Invention

The invention relates to a static random access memory (SRAM) structure, and more particularly, to a SRAM having the advantages of higher yield and faster read speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as gap of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides A static random access memory (SRAM) structure, the SRAM structure includes a substrate, a first inverter comprising a first pull-up transistor (PL1) and a first pull-down transistor (PD1) disposed on the substrate, a second inverter comprising a second (PL2) and a second pull-down transistor (PD2) on the substrate, wherein the first inverter and the second inverter are cross-coupled to each other, a first pass gate transistor (PG1A) and a second pass gate transistor (PG1B) electrically connected to an output terminal of the first inverter, a third pass gate transistor (PG2A) and a fourth pass gate transistor (PG2B) electrically connected to an output terminal of the second inverter, wherein a gate of the PG1A and a gate of the PG2A electrically connected to a first word line, a gate of the PG1B and a gate of the PG2B electrically connected to a second word line, a plurality of transistors including the PL1, the PL2, the PD1, the PD2, the PG1A, the PG1B, the PG2A and the PG2B, each transistor comprises a gate structure crosses over a fin structure, wherein the PG1A and the PG1B comprise a first fin structure, the PG2A and the PG2B comprise a second fin structure, a first local interconnection layer disposed between the PG1A and the PG1B, and disposed on the first fin structure of the PG1A, the first fin structure of the PG1B, the fin structure of the PL1 and the fin structure of the PD1, wherein the first local interconnection layer is a monolithically formed structure, and a second local interconnection layer disposed between the PG2A and the PG2B, and disposed on the second fin structure of the PG2A, the second fin structure of the PG2B, the fin structures of the PL2 and the fin structure of the PD2, wherein the second local interconnection layer is a monolithically formed structure.

The present invention further provides a static random access memory (SRAM) structure, the SRAM structure includes a substrate, a first inverter comprising a first pull-up transistor (PL1) and a first pull-down transistor (PD1) disposed on the substrate, a second inverter comprising a second (PL2) and a second pull-down transistor (PD2) on the substrate, wherein the first inverter and the second inverter are cross-coupled to each other, a first pass gate transistor (PG1A) and a second pass gate transistor (PG1B) electrically connected to an output terminal of the first inverter, a third pass gate transistor (PG2A) and a fourth pass gate transistor (PG2B) electrically connected to an output terminal of the second inverter, wherein a gate of the PG1A and a gate of the PG2A electrically connected to a first word line, a gate of the PG1B and a gate of the PG2B electrically connected to a second word line, a plurality of transistors including the PL1, the PL2, the PD1, the PD2, the PG1A, the PG1B, the PG2A and the PG2B, each transistor comprises a gate structure crosses over a diffusion region, wherein the PG1A and the PG1B comprise a first diffusion region, the PG2A and the PG2B comprise a second diffusion region, a first local interconnection layer disposed between the PG1A and the PG1B, and disposed on the first diffusion region of the PG1A, the first diffusion region of the PG1B, the diffusion region of the PL1 and the diffusion region of the PD1, wherein the first local interconnection layer is a monolithically formed structure, and a second local interconnection layer disposed between the PG2A and the PG2B, and disposed on the second diffusion region of the PG2A, the second diffusion region of the PG2B, the diffusion regions of the PL2 and the diffusion region of the PD2, wherein the first local interconnection layer is a monolithically formed structure.

One feature of the present invention is that the first pass gate transistor and the second pass gate transistor share the same fin structure. Likewise, the third pass gate transistor and the fourth pass gate transistor share the same fin structure. Applicants have found that by the above configuration, the elements have high symmetry arrangement, and when the signal is generated, the signal path length of each pass gate transistor is substantially equal. Therefore, in the operation of static random access memory, the errors caused by the difference of the signal path length can be reduced, thereby improving the performance of the static random access memory.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
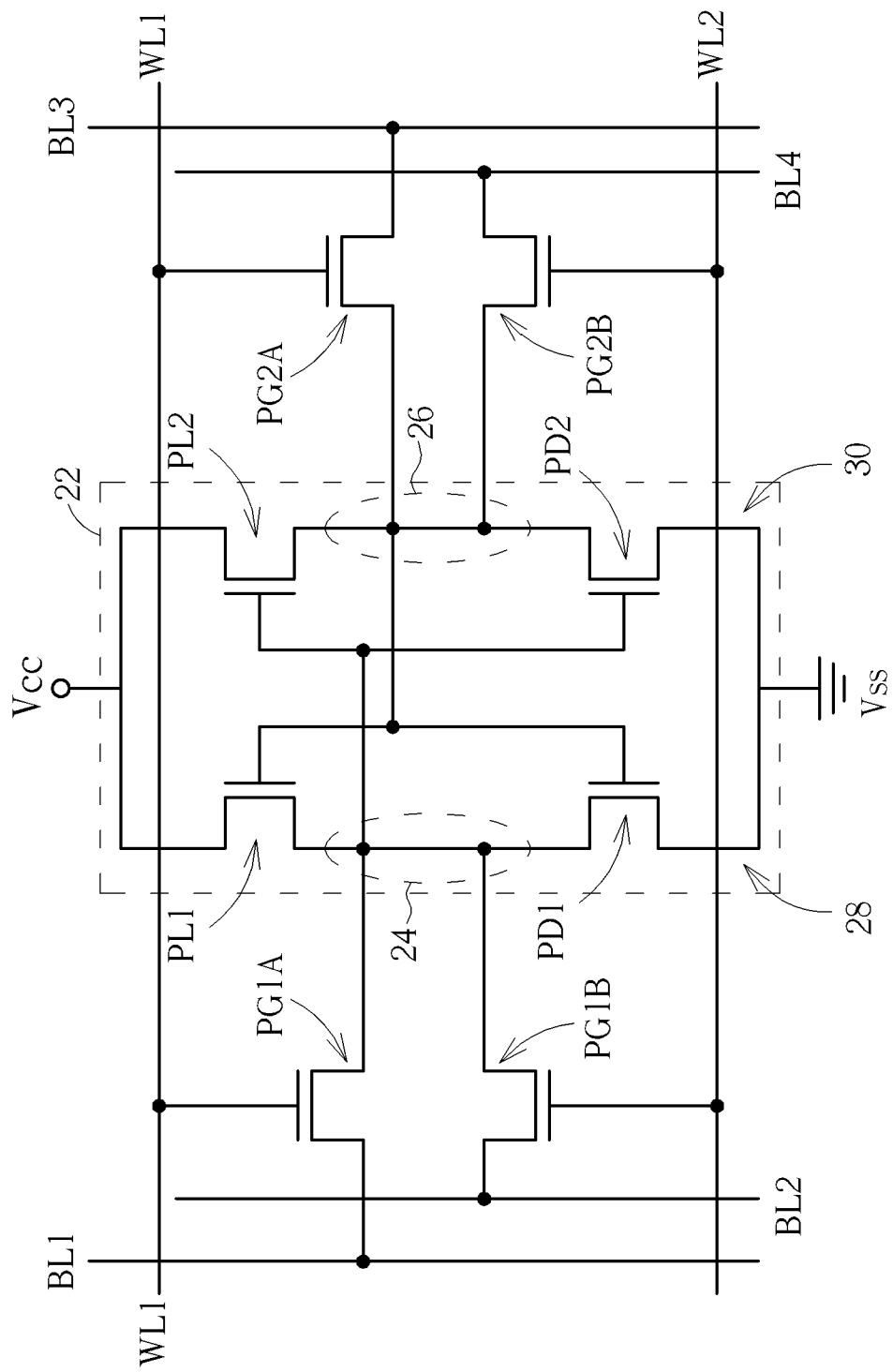
FIG. 1 illustrates a circuit diagram of an eight-transistor SRAM (8T-SRAM) cell according to a first preferred embodiment of the present invention.
Figure 2:
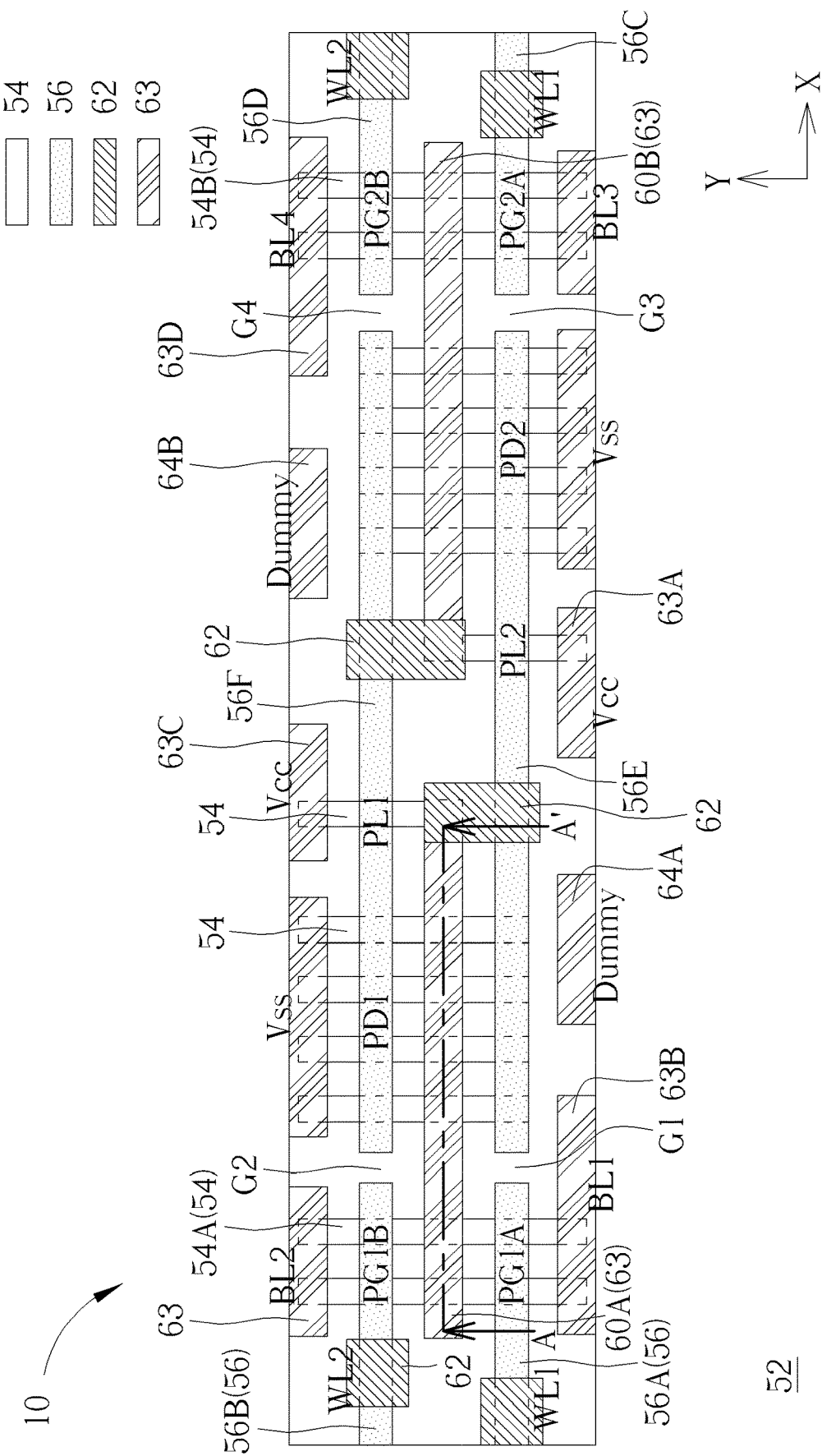
FIG. 2 illustrates a layout diagram of an 8T-SRAM according to the first preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 6T-SRAM cell 10 is composed of a first pull-up transistor PL1, a second pull-up transistor PL2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PL1 and PL2, and the first and the second pull-down transistors PD1 and PD2 constitute a latch circuit 22 that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PL1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PL2 and the second pull-down transistor PD2 constitute another inverter and a series circuit 30. One end of the series circuit 30 is connected to the voltage source Vcc and the other end of the series circuit 30 is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PLs), the at least one pull-down transistors (PDs), and the at least two pass gate transistor (PGs) includes a fin field-effect transistor (FinFET).

The storage node 24 is connected to the respective gates of the second pull-down transistor PD2 and the second pull-up transistor PL2. The storage node 24 is also connected to the drains of the first pull-down transistor PD1, the first pull-up transistor PL1, the first pass gate transistor PG1A and the second pass gate transistor PG1B. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2, the third pass gate transistor PG2A and the fourth pass gate transistor PG2B. The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

In this embodiment, an 8T-SRAM cell 10 is disposed on a substrate 52, such as a silicon substrate or silicon-on-insulator (SOI) substrate. The substrate may be a planar substrate, or a plurality of fin structures 54 may be formed on the substrate 52. In this embodiment, take an 8T-SRAM with fin structures 54 as an example, but the present invention is not limited thereto. In another case, the planar SRAM (the SRAM without comprising fin structures) may also be comprised within the scope of the present invention. In addition, a shallow trench isolation (STI, not shown) is disposed between each fin structure 54.

In addition, a plurality of gate structures 56 are formed on the substrate 52. Each transistor (including the first pull-up transistor PL1, the first pull-down transistor PD1, the second pull-up transistor PL2, the second pull-down transistor PD2, the first pass gate transistor PG1A, the second pass gate transistor PG1B, the third pass gate transistor PG2A, and the fourth pass gate transistor PG2B mentioned above) comprises a gate structure 56 crossing over at least one fin structure 54, to form the transistors.

As shown in FIG. 2, in order to clearly define the position of each gate structure 56, the gate structure 56 is labeled to a first gate structure 56A, a second gate structure 56B, a third gate structure 56C, a fourth gate structure 56D, a fifth gate structure 56E and a sixth gate structure 56F. The first gate structure 56A crosses over the fin structure 54 to form the first pass gate transistor PG1A; the second gate structure 56B crosses over the fin structure 56B to form the second pass gate transistor PG1B; the third gate structure 56C crosses over the fin structure 54 to form the third pass gate transistor PG2A; the fourth gate structure 56D crosses over the fin structure 54 to form the fourth pass gate transistor PG2B; the fifth gate structure 56E crosses over at least two fin structures 54, to form the second pull-up transistor PL2 and the second pull-down transistor PD2; the sixth gate structure 56F crosses over at least two fin structures 54, to form the first pull-up transistor PL1 and the first pull-down transistor PD1. It is to be understood that all of the first gate structure 56A to the sixth gate structure 56F belong to the gate structure 56.

In the present invention, each gate structure 56 is arranged in a first direction (e.g., an X-axis), and each fin structure 54 is arranged in a second direction (e.g., Y-axis). Preferably, the first direction and the second direction are perpendicular to each other.

In addition, during the process for forming the first gate structure 56A to the sixth gate structure 56F, at least one strip shaped gate structure (not shown) is formed, and then the strip shaped gate structure is divided into a plurality of gate structures through the photolithography process and the etching process. As shown in FIG. 2, the first gate structure 56A, the third gate structure 56C and the fifth gate structure 56E are divided by a same gate structure. On the other hand, the second gate structure 56F, the fourth gate structure 56D and the sixth gate structure 56F are divided by a same gate structure. In addition, different strip shaped gate structures may be partially removed by a same etching process, so that the removed portions may be aligned with each other. For example, a first gap G1 is disposed between the first gate structure 56A and the fifth gate structure 56E; a second gap G2 is disposed between the second gate structure 56B and the sixth gate structure 56F, the first gap G1 and the second gap G2 are aligned with each other in the Y-axis direction. Similarly, a third gap G3 is disposed between the third gate structure 56C and the fifth gate structure 56E, a fourth gap G4 is disposed between the fourth gate structure 56D and the sixth gate structure 56F, the third gap G3 and the fourth gap G4 are aligned with each other in the Y-axis direction.

The present invention further comprises a first local interconnection layer 60A and a second local interconnection layer 60B arranged in a first direction. The first local interconnection layer 60A crosses over the fin structure 54 of the first pull-up transistor PL1, the fin structure 54 of the first pull-down transistor PD1, the fin structure 54 of the first pass gate transistor PG1A and the fin structure 54 of the second pass gate transistor PG1B simultaneously. The second local interconnection layer 60B crosses the fin structure 54 of the second pull-up transistor PL2, the fin structure 54 of the second pull-down transistor PD2, the fin structure 54 of the third pass gate transistor PG2A, and the fin structure 54 of the fourth pass gate transistor PG2B simultaneously.

Figure 3:
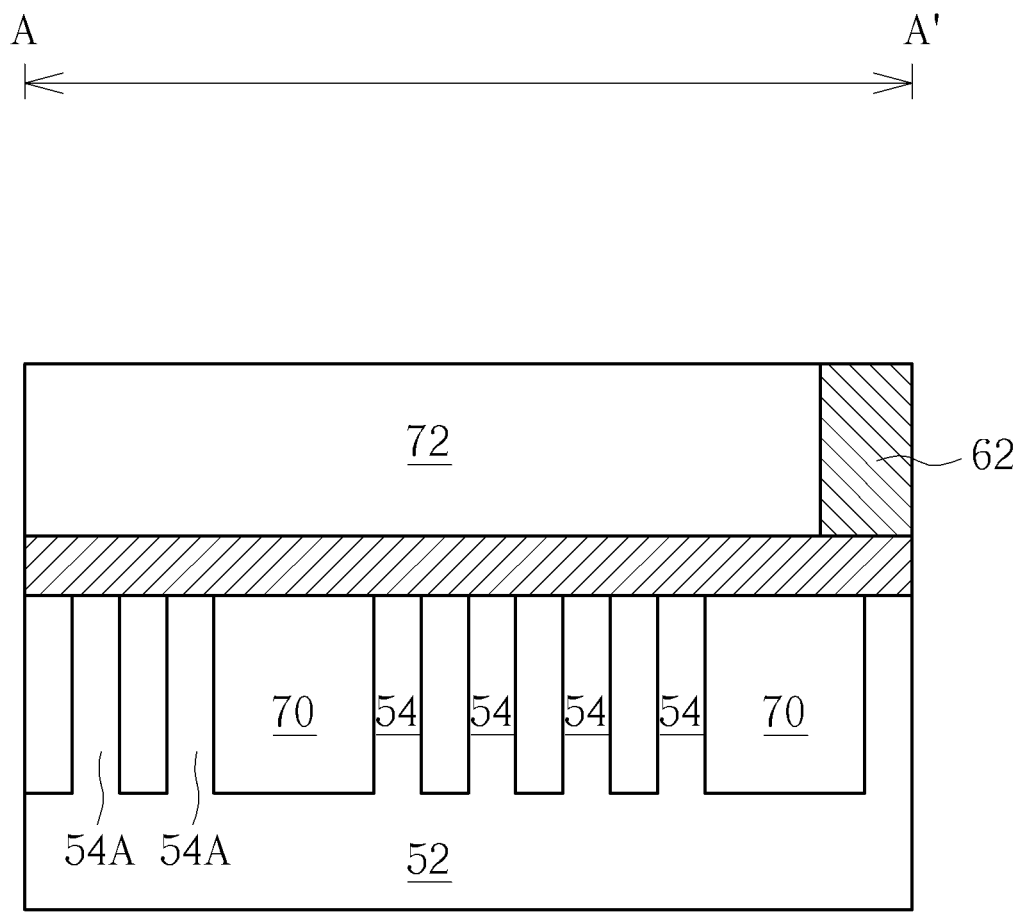
FIG. 3 shows a cross-sectional view taken along the cross-sectional line A-A' of FIG. 2.

In addition, please refer to FIG. 3, which shows a cross-sectional view taken along the cross-sectional line A-A' of FIG. 2. In the present invention, the first local interconnection layer 60A and the second local interconnection layer 60B are monolithically formed structure (e.g., one-piece structure or integrally molded structure) respectively. Taking the first local interconnection layer 60A as an example, as shown in FIG. 3, the fin structures 54A and the fin structures 54 are disposed on the substrate, and disposed in a first dielectric layer 70. The first local interconnection layer 60A is disposed in a second dielectric layer 72 that is disposed on the first dielectric layer 70, and the first local interconnection layer 60A contacts the fin structures 54A and the fin structures 54 directly. Similarly, the second local interconnection layer 60B is also disposed in the second dielectric layer 72, contacting the fin structures 54B and the fin structures 54 directly.

In addition, a plurality of contact plugs 62 and a plurality of contact layers 63 are formed on the substrate 52, the contact plugs 62 and the contact layers 63 are used to connect different transistors (e.g., a gate of the second pull-up transistor PL2 and drain of the first pull-up transistor PL1 are connected to each other through the contact plug 62 and the contact layer 63), or used to connect the transistors to other elements (e.g., a source of the first pull-up transistor PL1 is connected to the voltage source Vcc). In FIG. 2, the elements that connected to each contact plug or each contact layer (for example, the voltage source Vcc, the voltage source Vss, the first word line WL1, the second word line WL2, the first bit line BL1, the second bit line BL2, the third bit line BL3, and the fourth bit line BL4) are labeled on each contact plug 62 or each contact layer 63 directly, to clearly represent the corresponding elements of the contact plugs 62 and the contact layers 63.

One feature of the present invention is that the first pass gate transistor PG1A shares the same fin structure (here defined as the first fin structure 54A) with the second pass gate transistor PG1B. Similarly, the third pass gate transistor PG2A shares the same fin structure (defined herein as the first fin structure 54B) with the fourth pass gate transistor PG2B.

Applicants have found that by the above design, the arrangement of the elements has high symmetry, when the signal is generated, the signal path length of each pass gate transistor is substantially equal. More specifically, please refer to FIG. 3, which shows a schematic diagram when each signal flows from each bit line to a voltage source Vss. The signal 70A is generated from the first bit line BL1 and flows through the first pass gate transistor PG1A to the voltage source Vss; the signal 70B is generated from the second bit line BL2 and flows through the second pass gate transistor PG1B to the voltage source Vss; the signal 70C is generated from the third bit line BL3 and flows through the third pass gate transistor PG2A to the voltage source Vss; the signal 70D is generated from the fourth bit line BL4 and flows through the fourth pass gate transistor PG2B to the voltage source Vss. As shown in FIG. 3, the path lengths of the signals 70A, 70B, 70C and 70D are substantially equal. Therefore, in the operation of the static random access memory, the errors caused by the difference of the signal path length can be reduced, thereby improving the performance of the static random access memory.

Figure 4:
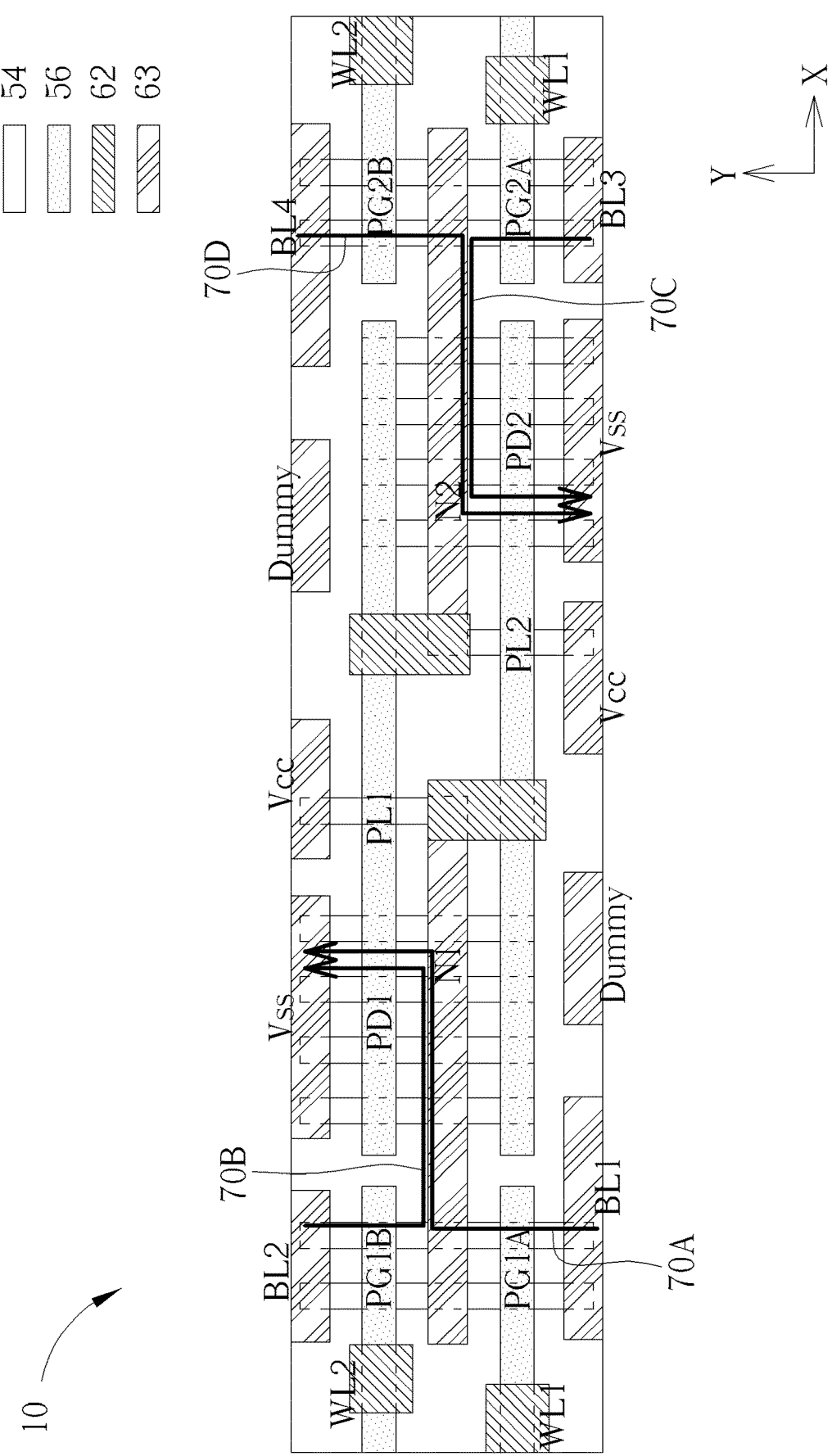
FIG. 4 shows a schematic diagram when each signal flows from each bit line to a voltage source Vss.

In addition, referring to FIG. 2 or FIG. 4, the contact structure connecting the second pull-up transistor PL2 and the voltage source Vcc is defined as the contact structure 63A, the contact structure connecting the first pass gate transistor PG1A and the first bit line BL1 is defined as the contact structure 63B, the contact structure connecting the first pull-up transistor PL1 and the voltage source Vcc is defined as the contact structure 63C, and the contact structure connecting the fourth pass gate transistor PG2B and the fourth bit line BL4 is defined as the contact structure 63D. In the present invention, since each contact structure is also divided by an strip shaped contact structure, a dummy contact structure 64A is therefore formed between the contact structure 63A and the contact structure 63B, and a dummy contact structure 64B is disposed between the contact structure 63C and the contact structure 63D. The existing of a dummy contact structure helps to balance the density of the elements in the region.

Figure 5:
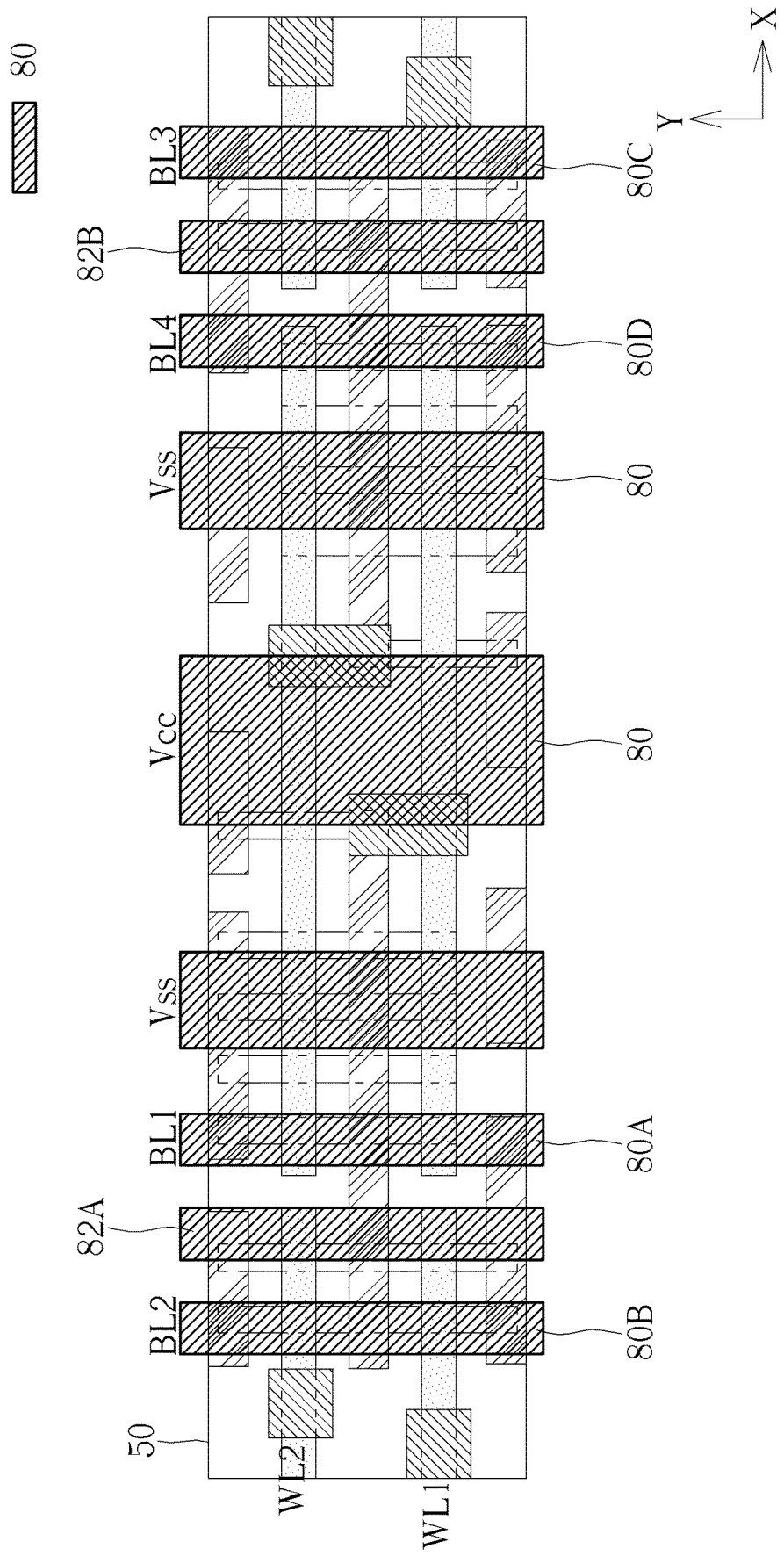
FIG. 5 illustrates a layout diagram of an 8T-SRAM according to the first preferred embodiment of the present invention.

The structure shown in FIG. 2 is formed in a same layer (for example, a dielectric layer). Next, on the dielectric layer, other dielectric layers are formed, and a plurality of contact structures or a plurality of wire structures are formed in the upper dielectric layer. FIG. 5 shows the layout of the upper dielectric layer above the structure shown in FIG. 2. In FIG. 5, a plurality of metal wires 80 are formed and are connected to the corresponding contact layers 63 in the lower layer by a plurality of via structures (not shown). It is to be noted that the metal wire connecting the first bit line BL1 is defined as the metal wire 80A, the metal wire connecting the second bit line BL2 is defined as the metal wire 80B, the metal wire connecting the third bit line BL3 is defined as the metal wire 80C, the metal wire connecting the fourth bit line BL4 is defined as a metal wire 80D. Besides, the present invention further comprising a dummy line 82A disposed between the metal wire 80A and the metal wire 80B, and a dummy line 82B disposed between the metal wire 80C and the metal wire 80D. The existing of a dummy line helps to reduce cross talk between the metal wires.

In the following processes, other dielectric layers, contact structures and metal layers may be formed and disposed above the elements. Since the present invention does not limit the shape, number of the following-formed contact structures and the metal layers, so the contact structures and the metal layers will not be described here.

Figure 6:
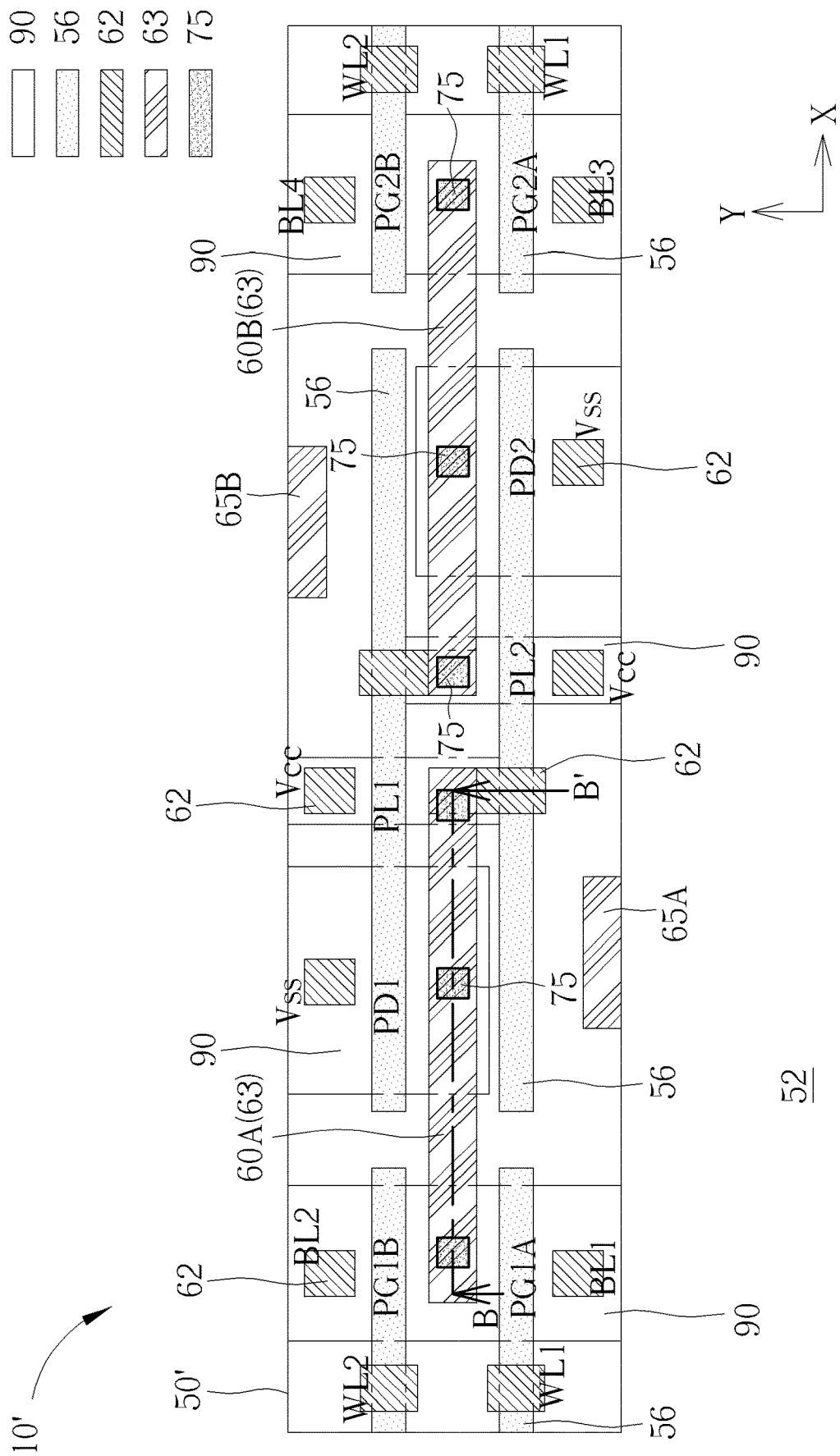
FIG. 6 illustrates a layout diagram of an 8T-SRAM according to another preferred embodiment of the present invention.

Besides, in the above embodiment, each transistor is fin transistor, including the gate structure formed on the fin structure. However, in the present invention, each transistor may also include a planar transistor, that is, the fin structures mentioned above can be replaced by a plurality of diffusion regions. As shown in FIG. 6, an 8T-SRAM memory cell 10' located in a region 50' is provided, the 8T-SRAM memory cell 10' is disposed on a substrate 52 such as a silicon substrate or a silicon-on-insulator (SOI) substrate with a plurality of diffusion regions 90 and a plurality of gate structures 56. The gate structure 56 cross over the diffusion regions 90, to form a plurality of transistors, such as a first pull-up transistor PL1, a first pull-down transistor PD1, a second pull-up transistor, and a second pull-up transistor, and a plurality of gate structures 56, PL2, a second pull-down transistor PD2, a first pass gate transistor PG1A, a second pass gate transistor PG1B, a third pass gate transistor PG2A, and a fourth transfer transistor PG2B (see FIG. 1). The remaining elements not mentioned, such as a plurality of contact plugs 62, a plurality of contact layers 63, a plurality of metal wires (not shown) and a dummy line (not shown), etc. (referring to FIG. 2 and FIG. 4) are same as that of in the first preferred embodiment, and they will not be described here. In addition, the present embodiment further comprises a dummy layer 65A located between contact structure connecting the first bit line BL1 and the contact structure 62 connecting the voltage source Vcc; a dummy layer 65B disposed between the contact structure connecting the fourth bit lines BL4 and the contact structure connecting the voltage source Vcc. The existing of dummy layers can reduce the density difference of the component.

Similarly, the present embodiment comprises a first local interconnection layer 60A crosses over the diffusion region 90 of the first pull-up transistor PL1, the diffusion region 90 of the first pull-down transistor PD1, the diffusion region 90 of the first pass gate transistor PG1A and the diffusion region 90 of the second pass gate transistor PG1B simultaneously. And a second local interconnection layer 60B crosses the diffusion region 90 of the second pull-up transistor PL2, the diffusion region 90 of the second pull-down transistor PD2, the diffusion region 90 of the third pass gate transistor PG2A, and the diffusion region 90 of the fourth pass gate transistor PG2B simultaneously.

Figure 7:
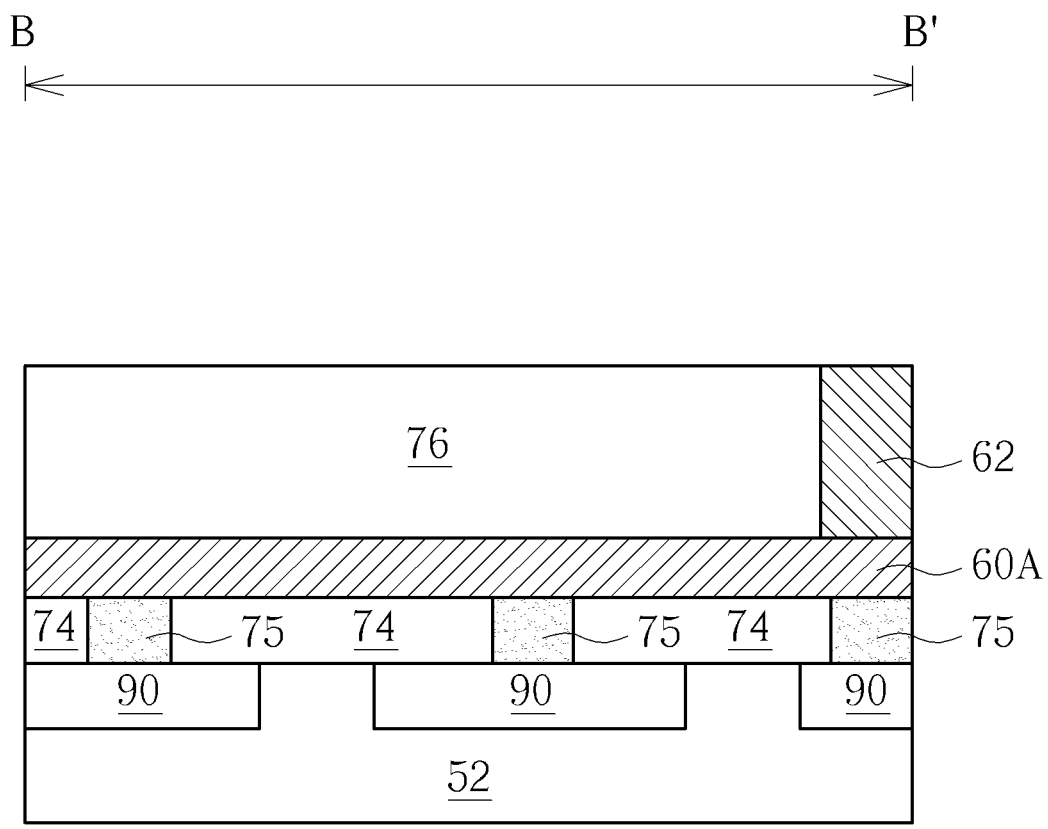
FIG. 7 shows a cross-sectional view taken along the cross-sectional line B-B' of FIG. 6.

Please refer to FIG. 7, which shows a cross-sectional view taken along the cross-sectional line B-B' of FIG. 6. In the present invention, the first local interconnection layer 60A and the second local interconnection layer 60B are monolithically formed structure (e.g., one-piece structure or integrally molded structure) respectively. Taking the first local interconnection layer 60A as an example, as shown in FIG. 7, the diffusion regions 90 are disposed in the substrate. A third dielectric layer 74 is formed on the substrate 52, a plurality of via plugs 75 and the first local interconnection layer 60A are disposed in the third dielectric layer 74. Each via plug 75 is electrically to a diffusion region 90 and directly contacts the diffusion region 90, for example, the three via plugs 75 shown in FIG. 7 are electrically connected to the first local interconnection layer 60A. In addition, a fourth dielectric layer 76 is formed on the third dielectric layer 74, and the contact plug 62 is disposed in the fourth dielectric layer and electrically connected to the first local interconnection layer 60A. Similarly, the second local interconnection layer 60B is also disposed in the third dielectric layer 74, contacting the plurality of via plugs 75 directly.

One feature of the present invention is that the first pass gate transistor and the second pass gate transistor share the same fin structure. Likewise, the third pass gate transistor and the fourth pass gate transistor share the same fin structure. Applicants have found that by the above configuration, the elements have high symmetry arrangement, and when the signal is generated, the signal path length of each pass gate transistor is substantially equal. Therefore, in the operation of static random access memory, the errors caused by the difference of the signal path length can be reduced, thereby improving the performance of the static random access memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) structure, comprising:
    a substrate;
    a first inverter comprising a first pull-up transistor (PL1) and a first pull-down transistor (PD1) disposed on the substrate;
    a second inverter comprising a second (PL2) and a second pull-down transistor (PD2) on the substrate, wherein the first inverter and the second inverter are cross-coupled to each other;
    a first pass gate transistor (PG1A) and a second pass gate transistor (PG1B) electrically connected to an output terminal of the first inverter, a third pass gate transistor (PG2A) and a fourth pass gate transistor (PG2B) electrically connected to an output terminal of the second inverter, wherein a gate of the PG1A and a gate of the PG2A electrically connected to a first word line, a gate of the PG1B and a gate of the PG2B electrically connected to a second word line;
    a plurality of transistors including the PL1, the PL2, the PD1, the PD2, the PG1A, the PG1B, the PG2A and the PG2B, each transistor comprises a gate structure crosses over a fin structure, wherein the PG1A and the PG1B comprise a first fin structure, the PG2A and the PG2B comprise a second fin structure;
a first local interconnection layer disposed between the PG1A and the PG1B, and disposed on the first fin structure of the PG1A, the first fin structure of the PG1B, the fin structure of the PL1 and the fin structure of the PD1, wherein the first local interconnection layer simultaneously contacts the first fin structure of the PG1A, the first fin structure of the PG1B, the fin structure of the PL1 and the fin structure of the PD1 directly; and
a second local interconnection layer disposed between the PG2A and the PG2B, and disposed on the second fin structure of the PG2A, the second fin structure of the PG2B, the fin structures of the PL2 and the fin structure of the PD2.

2. The static random access memory structure of claim 1, wherein the PG1A comprises a first gate structure, the PG1B comprises a second gate structure, the PG2A comprises a third gate structure, the PG2B comprises a fourth gate structure, the PL2 and the PD2 comprise a fifth gate structure, the PL1 and the PD1 comprise a sixth gate structure.

3. The static random access memory structure of claim 2, wherein the first gate structure, the second gate structure, the third gate structure, the fourth gate structure, the fifth gate structure and the sixth gate structure are arranged in a first direction.

4. The static random access memory structure of claim 3, further comprising a first gap disposed between the first gate structure and the fifth gate structure, a second gap disposed between the second gate structure and the sixth gate structure, the first gap and the second gap are aligned with each other along a second direction, and the second direction being perpendicular to the first direction.

5. The static random access memory structure of claim 4, further comprising a third gap disposed between the third gate structure and the fifth gate structure, a fourth gap disposed between the fourth gate structure and the sixth gate structure, the third gap and the fourth gap are aligned with each other along the second direction.

6. The static random access memory structure of claim 3, wherein the first local interconnection layer and the second local interconnection layer are arranged along the first direction.

7. The static random access memory structure of claim 4, further comprising:
a first bit line connected to the PG1A, wherein the first bit line is arranged along the second direction;
a second bit line connected to the PG1B, wherein the second bit line is arranged along the second direction;
a first dummy line arranged along the second direction and located between the first bit line and the second bit line.

8. The static random access memory structure of claim 4, further comprising:
a third bit line connected to the PG2A, wherein the third bit line is arranged along the second direction;
a fourth bit line connected to the PG2B, wherein the fourth bit line is arranged along the second direction;
a second dummy line arranged along the second direction and located between the third bit line and the fourth bit line.

9. The static random access memory structure of claim 1, further comprising a plurality of contact structures disposed on the substrate, the plurality of contact structures comprising a first Vcc contact structure connected to a source of the PL2, a first bit line contact structure being connected to a source of the PG1A, and a first dummy layer disposed between said first Vcc contact structure and the first bit line contact structure.

10. The static random access memory structure of claim 9, further comprising a second Vcc contact structure connected to a source of the PL1, a fourth bit line contact structure connected to a source of the PG2B, and a second dummy layer disposed between the second Vcc contact structure and the fourth bit line contact structure.

11. The static random access memory structure of claim 1, wherein the fin structures, the first fin structure and the second fin structure are disposed in a first dielectric layer, and wherein the first local interconnection layer and the second local interconnection layer are disposed in a second dielectric layer that is disposed on the first dielectric layer.

12. A static random access memory (SRAM) structure, comprising:
a substrate;
a first inverter comprising a first pull-up transistor (PL1) and a first pull-down transistor (PD1) disposed on the substrate;
a second inverter comprising a second (PL2) and a second pull-down transistor (PD2) on the substrate, wherein the first inverter and the second inverter are cross-coupled to each other;
a first pass gate transistor (PG1A) and a second pass gate transistor (PG1B) electrically connected to an output terminal of the first inverter, a third pass gate transistor (PG2A) and a fourth pass gate transistor (PG2B) electrically connected to an output terminal of the second inverter, wherein a gate of the PG1A and a gate of the PG2A electrically connected to a first word line, a gate of the PG1B and a gate of the PG2B electrically connected to a second word line;
a plurality of transistors including the PL1, the PL2, the PD1, the PD2, the PG1A, the PG1B, the PG2A and the PG2B, each transistor comprises a gate structure crosses over a diffusion region, wherein the PG1A and the PG1B comprise a first diffusion region, the PG2A and the PG2B comprise a second diffusion region;
a first local interconnection layer disposed between the PG1A and the PG1B, and disposed on the first diffusion region of the PG1A, the first diffusion region of the PG1B, the diffusion region of the PL1 and the diffusion region of the PD1, wherein the first local interconnection layer simultaneously contacts the first diffusion region of the PG1A, the first diffusion region of the PG1B, the diffusion region of the PL1 and the diffusion region of the PD1 directly; and
a second local interconnection layer disposed between the PG2A and the PG2B, and disposed on the second diffusion region of the PG2A, the second diffusion region of the PG2B, the diffusion regions of the PL2 and the diffusion region of the PD2.

13. The static random access memory structure of claim 12, wherein the PG1A comprises a first gate structure, the PG1B comprises a second gate structure, the PG2A comprises a third gate structure, the PG2B comprises a fourth gate structure, the PL2 and the PD2 comprise a fifth gate structure, the PL1 and the PD1 comprise a sixth gate structure.

14. The static random access memory structure of claim 13, wherein the first gate structure, the second gate structure, the third gate structure, the fourth gate structure, the fifth gate structure and the sixth gate structure are arranged in a first direction.

15. The static random access memory structure of claim 14, further comprising a first gap disposed between the first gate structure and the fifth gate structure, a second gap disposed between the second gate structure and the sixth gate structure, the first gap and the second gap are aligned with each other along a second direction, and the second direction being perpendicular to the first direction.

16. The static random access memory structure of claim 15, further comprising a third gap disposed between the third gate structure and the fifth gate structure, a fourth gap disposed between the fourth gate structure and the sixth gate structure, the third gap and the fourth gap are aligned with each other along the second direction.

17. The static random access memory structure of claim 14, wherein the first local interconnection layer and the second local interconnection layer are arranged along the first direction.

18. The static random access memory structure of claim 15, further comprising:
  a first bit line connected to the PG1A, wherein the first bit line is arranged along the second direction;
  a second bit line connected to the PG1B, wherein the second bit line is arranged along the second direction;
  a first dummy line arranged along the second direction and located between the first bit line and the second bit line.

19. The static random access memory structure of claim 15, further comprising:
  a third bit line connected to the PG2A, wherein the third bit line is arranged along the second direction;
  a fourth bit line connected to the PG2B, wherein the fourth bit line is arranged along the second direction;
  a second dummy line arranged along the second direction and located between the third bit line and the fourth bit line.

20. The static random access memory structure of claim 12, further comprising a plurality of contact structures disposed on the substrate, the plurality of contact structures comprising a first Vcc contact structure connected to a source of the PL2, a first bit line contact structure being connected to a source of the PG1A, and a first dummy layer disposed between said first Vcc contact structure and the first bit line contact structure.

21. The static random access memory structure of claim 20, further comprising a second Vcc contact structure connected to a source of the PL1, a fourth bit line contact structure connected to a source of the PG2B, and a second dummy layer disposed between the second Vcc contact structure and the fourth bit line contact structure.

22. The static random access memory structure of claim 12, wherein the diffusion region, the first diffusion region and the second diffusion region are disposed in the substrate, and wherein the first local interconnection layer and the second local interconnection layer are disposed in a first dielectric layer that is disposed on the substrate.

* * * * *